United States Patent
Sogani

(10) Patent No.: US 8,055,966 B1
(45) Date of Patent: *Nov. 8, 2011

(54) BUILT-IN-SELF-REPAIR ARRANGEMENT FOR A SINGLE MULTIPLE-INTEGRATED CIRCUIT PACKAGE AND METHODS THEREOF

(75) Inventor: Dhiraj Sogani, San Jose, CA (US)

(73) Assignee: Wi2Wi, Inc., San Jose, CA (US)

( * ) Notice: Subject to any disclaimer, the term of this patent is extended or adjusted under 35 U.S.C. 154(b) by 580 days.

This patent is subject to a terminal disclaimer.

(21) Appl. No.: 11/958,284

(22) Filed: Dec. 17, 2007

(51) Int. Cl.
*G01R 31/3187* (2006.01)
*G01R 31/40* (2006.01)

(52) U.S. Cl. .......................... 714/733; 714/718

(58) Field of Classification Search .................. None
See application file for complete search history.

(56) References Cited

U.S. PATENT DOCUMENTS

| | | | |
|---|---|---|---|
| 5,570,035 A * | 10/1996 | Dukes et al. | 324/763 |
| 6,240,535 B1 * | 5/2001 | Farnworth et al. | 714/718 |
| 6,351,681 B1 | 2/2002 | Chih et al. | |
| 6,469,534 B1 | 10/2002 | Kimura | |
| 6,651,202 B1 * | 11/2003 | Phan | 714/733 |
| 6,734,693 B2 | 5/2004 | Nakayama | |
| 6,876,221 B2 | 4/2005 | Ishigaki | |
| 7,075,175 B2 | 7/2006 | Kazi et al. | |
| 7,383,475 B1 | 6/2008 | Corbin | |
| 7,795,894 B1 * | 9/2010 | Sogani | 324/763 |
| 2006/0248424 A1 | 11/2006 | Colunga et al. | |
| 2009/0052267 A1 * | 2/2009 | Kao | 365/230.01 |

OTHER PUBLICATIONS

"U.S. Appl. No. 11/958,290", filed Dec. 17, 2007.
"Non Final Office Action", U.S. Appl. No. 11/958,290, Mailing Date: Aug. 7, 2009.
"Notice of Allowance and Fees Due", U.S. Appl. No. 11/858,290, Mailing Date: May 6, 2010.

* cited by examiner

*Primary Examiner* — Jeffrey A Gaffin
*Assistant Examiner* — Dipakkumar Gandhi
(74) *Attorney, Agent, or Firm* — IP Strategy Group, P.C.

(57) ABSTRACT

A multiple integrated circuit arrangement within a single package is provided. The multiple integrated circuit arrangement includes a set of electronic components, which includes at least a set of dies. The first die of the set of dies is coupled to a first electronic component of the set of electronic components, wherein the first electronic component is not the first die. The arrangement includes a built-in-self-test (BIST) arrangement, which is at least partly encapsulated within the single package, wherein the BIST arrangement is configured for at least testing the first die of the set of dies. The arrangement also includes a built-in-self-repair (BISR) arrangement, which is at least partly encapsulated within the single package, wherein the BISR arrangement is configured for at least repairing the multiple integrated circuit arrangement.

20 Claims, 5 Drawing Sheets

BUILT-IN-SELF-REPAIR ARRANGEMENT FOR A SINGLE MULTIPLE-INTEGRATED CIRCUIT PACKAGE AND METHODS THEREOF

CROSS REFERENCE TO RELATED APPLICATIONS

The present invention is related to the following applications, all of which are incorporated herein by reference:

Commonly assigned application entitled "A Built-In-Self-Test Arrangement For A Single Multiple-Integrated Circuit Package And Methods Thereof," filed on even date herewith by the same inventor herein (application Ser. No. 11/958,290, now issued as U.S. Pat. No. 7,795,894 B1).

BACKGROUND OF THE INVENTION

Portable electronic devices, such as mobile telephones, MP3 players, notebooks, and the like, have become increasingly popular due to their relatively small size. In recent years, the portable electronic devices have become increasingly smaller in response to consumer's desire for smaller form factor. The reduction in size of the portable electronic devices is achieved partly by integrating System-in-Package (SiP). As discussed herein, a SiP refers to a plurality of integrated circuits, such as dies and package parts, assembled within a single package.

To facilitate discussion, FIG. 1 shows a simple schematic of a plurality of integrated circuits within a single SiP package 100. SiP 100 may include different types of dies, including, for example, a Bluetooth die 102, a Wi-Fi die 104, and two EEPROM (electrically erasable programmable read-only memory) dies 106 and 108. SiP 100 may also include different types of package parts, for example, baluns 110 and 112, a crystal 114, a BPF (band-pass filter) 116 and 118, and a switch 120. Since the signal transmitted by Wi-Fi die 104 may require amplification, a power amplifier 122 may also be attached to Wi-Fi die 104. In this example, power amplifier 122 is also a package part.

Those skilled in the arts are aware that dies are physically smaller than package parts. Also, dies are stackable; therefore, in comparison to package parts, more dies may be assembled within the same physical area In addition, dies are relatively cheaper than package parts since dies require less fabrication steps than package parts. However, dies tend to be less reliable than package parts since dies, generally, may not be fully tested. Although package parts are more reliable than dies, manufacturers may opt for a combination of dies and package parts in order to achieve the smaller form factor. In addition, since price is an important factor in the highly competitive consumer market, manufacturers may manage cost by utilizing less expensive components, such as dies. Thus, a typical SiP may have a combination of dies and package parts. Accordingly, the possibility of a "bad" die being encapsulated within a SiP is a possibility. As a result, the inclusion of 'bad" dies within a SiP may cause the SiP to experience a low performance yield and/or even cause the SiP to malfunction, thereby causing the portable electronic device to be defective.

One way to ensure that a SiP is working properly before installing the SiP into a portable electronic device is to test the SiP. Given that dies tend to be unreliable, testing a SiP usually focuses on testing the dies. Since the dies are encapsulated within the SiP, manufacturers of SiPs may need to provide a testing arrangement that enable die testing without damaging the SiP and/or the electronic components. A typical testing arrangement may include adding a plethora of pins that may extend outward from the dies and is physically visible from outside of the SiP "capsule", thereby enabling external testing mechanism to be attached to the testing arrangement. The types of pins that may be added may include, but are not limited to, probing pins, input pins, output pins, control pins, and the like. Unfortunately, the testing arrangement may cause the overall area size of the SiP to increase. In some circumstances, the overall area size of the SiP may increase by 50 percent due to the additional pins provided to facilitate testing of the dies within the SiP. Thus, with a testing arrangement, the possible small form factor that a SiP may provide is not maximized.

In addition, testing an electronic component, such as a die, within a "system" usually requires complex and sophisticated test factors. Since the die is part of a complex, interconnected system, the test factors may take into account not only the "test" die, but may also account for relationship between the "test" die and the other electronic components (e.g., dies, package parts, etc.) within the SiP. To adequately perform the test, external control mechanism and external test mechanism may be employed in order to assure that the individual dies are in "working order" and that the SiP, as a whole, is at maximum yield capacity.

BRIEF SUMMARY OF THE INVENTION

The invention relates, in an embodiment, to a multiple integrated circuit arrangement within a single package. The multiple integrated circuit arrangement includes a set of electronic components, which includes at least a set of dies. The first die of the set of dies is coupled to a first electronic component of the set of electronic components, wherein the first electronic component is not the first die. The arrangement includes a built-in-self-test (BIST) arrangement, which is at least partly encapsulated within the single package, wherein the BIST arrangement is configured for at least testing the first die of the set of dies. The arrangement also includes a built-in-self-repair (BISR) arrangement, which is at least partly encapsulated within the single package, wherein the BISR arrangement is configured for at least repairing the multiple integrated circuit arrangement.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
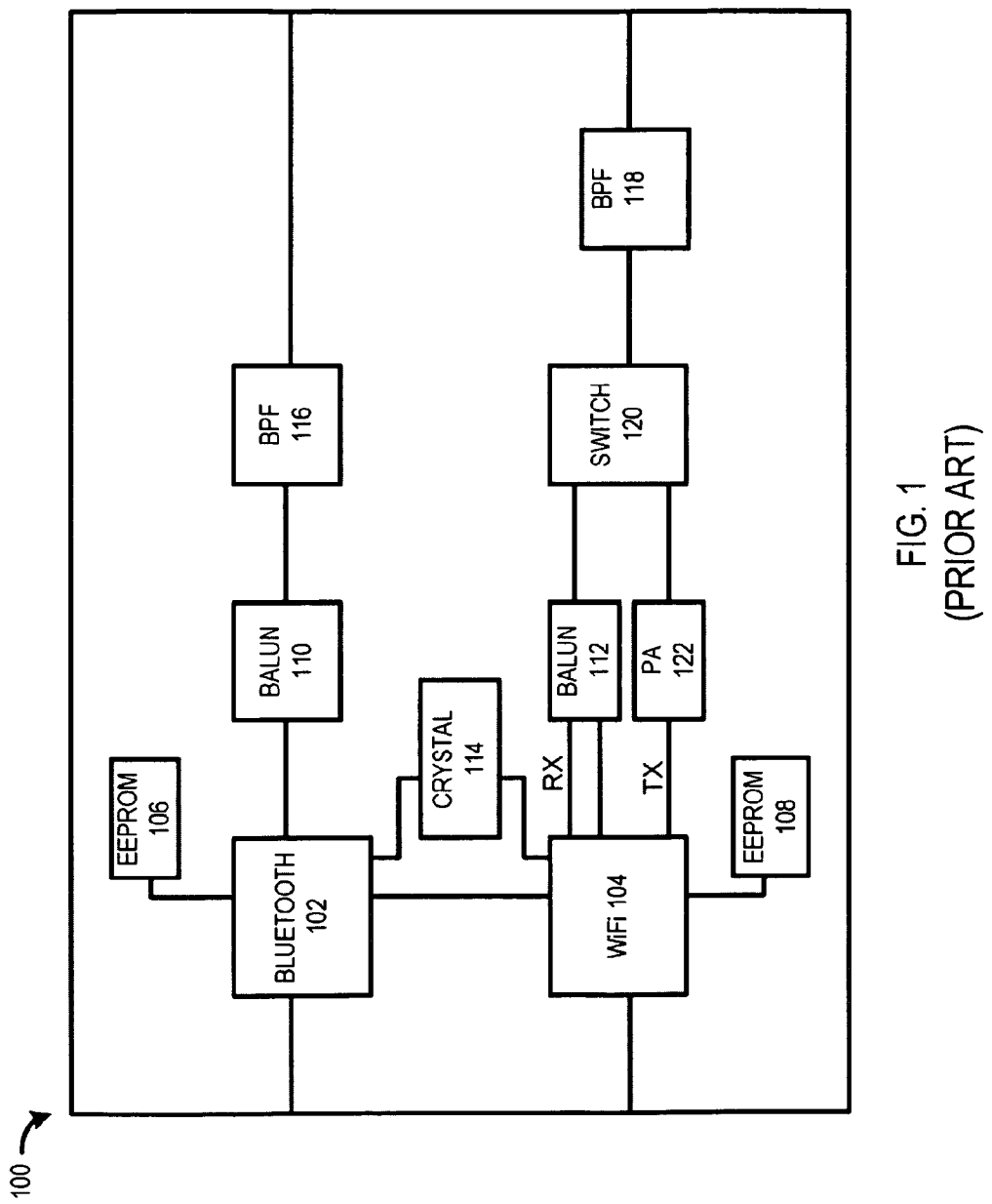
FIG. 1 shows a simple schematic of a plurality of integrated circuits within a single SiP package.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As aforementioned, System-in-Package (SiP) has become a popular arrangement for achieving small form factor while providing multiple functions within a single package. Unfortunately, SiPs may be subjected to performance issues due to faulty dies that may be encapsulated within the packages. In the prior art, testing a SiP to assure that each die is functioning properly can be a complex and tedious process since each die may not only be individually tested, but may also be tested in relation to other electronic components within the SiP. To facilitate testing, a plethora of pins may be coupled to the SiP to enable external testing mechanism to interact with the dies located within the SIP. As a result, the additional pins may result in an increase in the overall area size of the SIP.

In order to accommodate the demand for smaller form factors, some manufacturers may reduce the number of testing pins that may be available. However, the reduction in the number of testing pins may result in an incomplete test. Thus, the SiPs that may be utilized within personal electronic devices may still have a probability of failure. In other words, for SiPs with the same functionality, manufacturers of electronic devices have the option of including larger SiP with reliable performance or a smaller SIP with questionable performance.

Since an individual die is usually not fully tested, a die tends to be unreliable. Thus, a risk exists that at least one of the dies within a SIP may not perform properly, thereby causing the SiP to have a lower performance yield and/or may cause the SiP to malfunction. Consider the situation wherein, for example, a consumer has purchased an MP3 player that becomes defective soon after. Upon closer examination, the defect is caused by a SiP that has malfunction due to a "bad" memory die. Due to the "bad" memory die, the cost to fix the situation is no longer just the cost of replacing the "bad" memory die, which may only cost a few pennies. Instead, the manufacturer of MP3 players may also pay for the postage for recalling the product, hire a technician to service the defective product, replace the SiP (which is usually significantly more expensive then the cost of a die), and the like. In addition, the manufacturer of MP3 players may possibly lose future sales not only from the unhappy consumer, but also from other buyers who may be influenced by the consumer's negative experience. Consequently, if the manufacturer of the MP3 players does not trust the SiPs to perform properly, the manufacturer may change supplier.

As can be appreciated from the foregoing, sacrificing performance in favor of smaller form factor can have dire consequences. Thus, methods and arrangements for providing a small form factor with multiple functionalities without sacrificing performance are desired.

In one aspect of the invention, the inventor herein realized that the overall area size of the SiP may be substantially decreased by reducing the number of pins extending outward from the SiP. To reduce the number of pins, the inventor also realized that a mechanism may be provided to enable die testing within the SiP. The inventors further realized that by isolating each die within the SIP, the complicated test factors that may be required in the prior art to test a die may be substantially eliminated, thereby enabling the die to be tested as though the die has not been integrated within the SiP.

In accordance with embodiments of the present invention, a built-in self-test (BIST) arrangement is provided for testing dies within a single multiple-integrated circuit package, such as a SiP. Embodiments of the invention also include methods and arrangements for isolating the power plane for each die in order to create a testing environment that enable each die to be tested individually.

In this document, various implementations may be discussed using SiP as an example. This invention, however, is not limited to SiP and may include any single package that may include multiple integrated circuits. Instead, the discussions are meant as examples and the invention is not limited by the examples presented.

In an embodiment of the invention, a BIST arrangement may include an electronic component, such as a die, coupled to a set of pins extending from the die. To facilitate discussion, the die associated with the BIST arrangement is herein referred to as the BIST die. The BIST arrangement, in an embodiment, is located within the single multiple-integrated circuit package. By incorporating the BIST arrangement into the single multiple-integrated circuit package, the number of inputs/outputs pins (e.g., pins) may be minimized. In an example, the BIST die is coupled to each die via a set of pins, thereby enabling each die to be tested. Unlike the prior art, each die may not have a plurality of pins (e.g., pins to enable probing, testing, controlling, reporting, etc.) extending from the die to enable testing to be performed. Instead, a single pin may extend from each die, enabling the die to interact with the BIST die. Although more than one pin may couple a BIST die to another die, a single pin may enable the testing without adding unnecessary area requirement and cost to the single multiple-integrated circuit package.

In an embodiment of the invention, the mechanism for controlling the test, performing the test, and producing the test-related reports may be integrated within a BIST arrangement. In an example, the BIST arrangement may have a control pin, a pin for reporting the data collected, and the like. In an embodiment, a few of the pins coupled to the BIST die may be extended outward beyond the single multiple-integrated circuit package, thereby enabling the BIST arrangement to interact with external devices. In an example, test patterns stored by the BIST arrangement may be updated by connecting one of the pins, such as the input pin, to a computer system. Accordingly, the number of pins that may be visible outside of the "capsule" of the single multiple-integrated circuit package may be limited to a few and may have insignificant impact on the overall area size of the single multiple-integrated circuit package.

In an embodiment, the BIST arrangement may be in at least one of an active and a non-active state. When the BIST arrangement is active, the BIST arrangement may begin testing the dies within the single multiple-integrated circuit package. Even though the dies may be within a single multiple-integrated circuit package, the test patterns employed to test each die may be relatively simple in comparison to the prior art. Unlike the prior art, the test patterns for testing each die do not account for the other electronic components that may also be integrated within the same single multiple-integrated circuit package since embodiments of the invention enable a "test" die to be isolated.

As aforementioned, a single multiple-integrated circuit package may include a plurality of electrical components (including multiple dies and package parts). Each component is usually interacting with at least one other component. Thus, power is usually being shared between components. In an embodiment of the invention, in order to perform a valid test, the BIST arrangement may isolate the "test" die from the other electronic components in order to prevent the possibility of conflict during the testing. Also, by isolating the "test" die, the complicated and sophisticated test factors that may have been implemented in the prior art in order to account for the interaction between the electronic components may be simplified since the "test" die may now be isolated. In other words, the BIST arrangement may simulate a testing environment as though the "test" die is a "single die".

In an embodiment, creating an isolated environment for the "test" die may be achieved by isolating the power plane to the "test" die. Consider the situation wherein, for example, the "test" die is interacting with a second die. In order to create an isolated environment for testing, the BIST arrangement may disconnect the "test" die from the second die. One way to perform the disconnection is to stop the flow of power to the second die, thereby causing the second die to become inactive.

Once the isolated environment has been created, the BIST arrangement may perform the test. As can be appreciated from the foregoing, the single multiple-integrated circuit package with a BIST arrangement provides for a smaller more simplified architecture arrangement since each die is no longer required to have a plurality of pins coupled to the die in order to enable external testing of the dies. In addition, since the test patterns for each dies have been simplified, the testing time may be significantly reduced.

Accordingly, due to the nature of the dies, the possibility of a SiP with a "bad" die is not unlikely. With the BIST arrangement, a manufacturer may be able to identify SiPs with "bad" dies before assembling the products (e.g., mobile telephones, MP3, smart devices, etc.). However, discarding the entire SiP because of a single "bad" die can be an expensive and wasteful practice.

In one aspect of the invention, the inventor herein realized that the SiP may include electronic components that may be relatively inexpensive. In an example, the cost of a memory die, such as an electrically erasable programmable read-only memory (EEPROM), may be only a few pennies. The inventor herein realized that if a redundancy arrangement is provided within the SiP, the SiP may repair itself, thereby maximizing the yield performance of the SiP while substantially minimizing cost and waste.

In accordance with embodiments of the present invention, a built-in self-repair (BISR) arrangement facilitates redundancy within a single multiple-integrated circuit package. Embodiments of the invention also include methods and arrangements for integrating the BISR arrangement with the aforementioned BIST arrangement.

In an embodiment of the invention, a BISR arrangement may include an electronic component, such as a die, coupled to a set of pins. To facilitate discussion, the die associated with the BISR arrangement is herein referred to as the BISR die. In an embodiment, the BISR arrangement is incorporated within the single multiple-integrated circuit arrangement. In an embodiment, the BISR arrangement may include a pin connecting the BISR arrangement to a BIST arrangement, thereby enabling the BISR arrangement to interact with the BIST arrangement. Consider the situation wherein, for example, a first memory die is connected to a Wi-Fi (wireless fidelity) die. However, the first memory die may be defective and is unable to pass the test performed by the BIST arrangement. In an embodiment, the BIST arrangement may notify the BISR arrangement about the condition of the first memory die by sending a first control signal.

Upon receiving the notification from the BIST arrangement, the BISR arrangement may facilitate repair by sending instructions, via a second control signal, to a multiplexer. In an embodiment, the multiplexer may be coupled to a plurality of electronic components that may provide the same or similar functionality. Upon receiving the second control signal from the BISR arrangement, the multiplexer may decoupled the "failed" first memory die from the Wi-Fi die and coupled a second memory die to the Wi-Fi die. Hence, by implementing a BISR arrangement, each single multiple-integrated circuit package includes a self-repair mechanism, thereby maximizing SiP performance yield.

The features and advantages of the present invention may be better understood with reference to the figures and discussions that follow.

Figure 2:
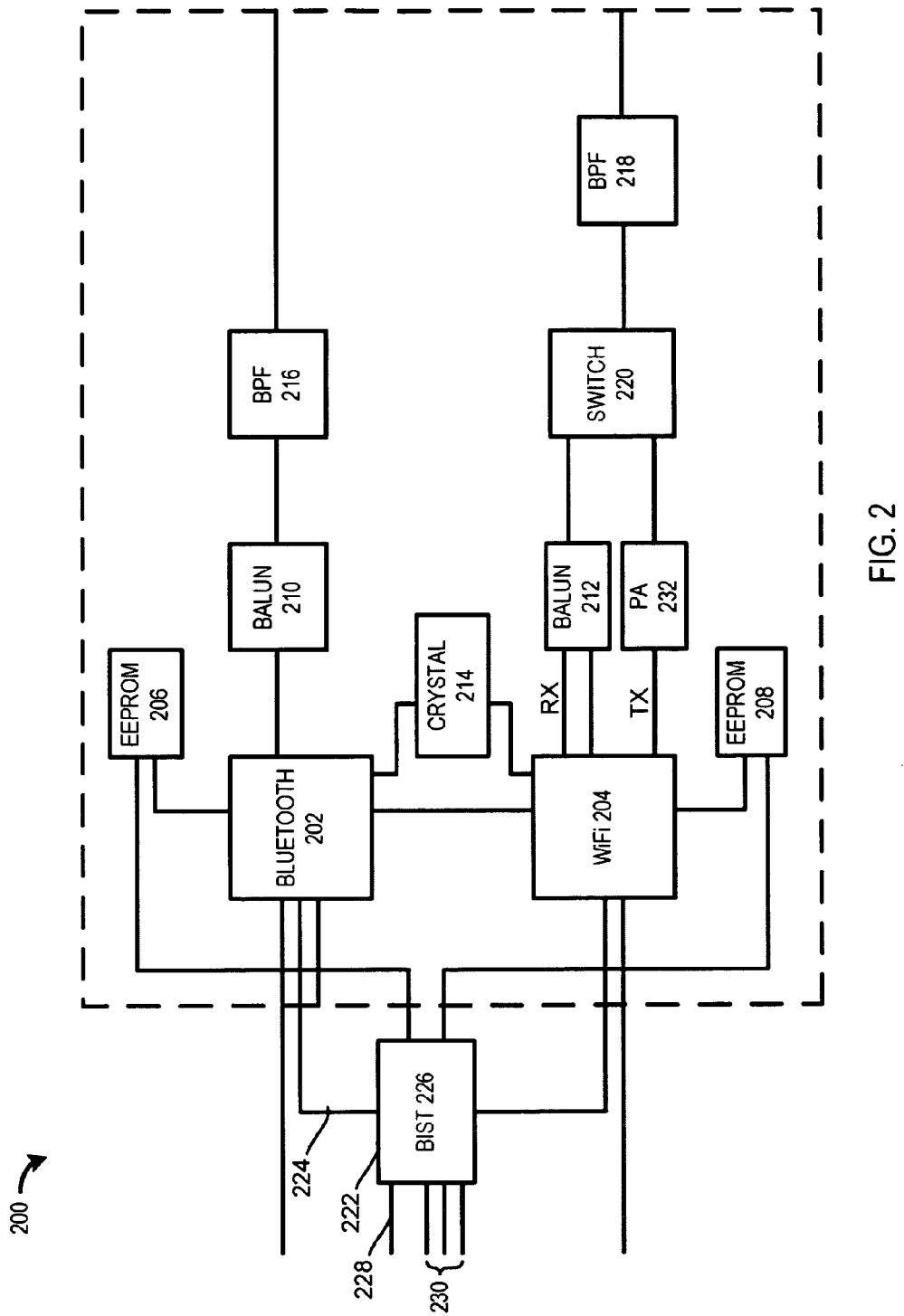
FIG. 2 shows, in an embodiment of the invention, a schematic diagram of a single multiple-integrated circuit package, such as a SiP, with a built-in-self-test arrangement.

FIG. 2 shows, in an embodiment of the invention, a schematic diagram of a single multiple-integrated circuit package, such as a SiP, with a BIST arrangement. A SiP 200 may include a plurality of electronic components, such as dies and package parts. In an example, SiP 200 may include different types of dies, for example, a Bluetooth die 202, a Wi-Fi die 204, and two EEPROM dies 206 and 208. SiP 200 may also include different types of package parts, for example, baluns 210 and 212, a crystal 214, a BPF (band-pass filter) 216 and 218, a switch 220, and a power amplifier 232 (for amplifying the signal being transmitted by Wi-Fi die 204).

As aforementioned, dies are generally not fully tested. As a result, single multiple-integrated circuit package with dies may experience performance issue. Therefore, a testing arrangement is needed to identify "bad" dies.

Unlike the prior art, a plethora of pins do not extend externally from the SiP in order to test the dies within the SiP. Instead, each die (Bluetooth die 202, Wi-Fi die 204, and EEPROM dies 206 and 208) may be coupled to a BIST arrangement 222 via a single pin. In an example, Bluetooth die 202 may be coupled to BIST arrangement 222 via a pin 224. Although the coupling arrangement may include more than one pin, a single pin may facilitate testing without adding unnecessary area requirement and cost to the single multiple-integrated circuit package.

In an embodiment of the invention, the mechanism for controlling the test, performing the test, and producing the test-related reports may be integrated within BIST arrangement 222. In an example, BIST arrangement 222 may include a BIST die 226 connected to a set of pins, including a control pin 228 and a set of input/output pins 230. As can be appreciated from the foregoing. BIST die 226 may be a die or other electronic components, such as package parts.

Control pin 228 may be utilized to activate or deactivate BIST arrangement 222. In an embodiment, the BIST arrangement may be in at least one of an active and a non-active state. Control pin 228 may be employed to control the state for BIST arrangement 222. In an example, control pin 228 may activate BIST arrangement 222 when a die needs to be tested. Similarly, control pin 228 may deactivate BIST arrangement 222 when a testing is not required to be performed.

Set of input/output pins 230 may be configured to collect and distribute the test results. Accordingly, the number of pins that may be employed may depend upon a manufacturer's preference. In an example, set of input/output pins 230 may be a single pin. In another example, set of input/output pins 230 may be series of pins.

As can be appreciated from the foregoing, by implementing a BIST arrangement, testing may be performed by a single multiple-integrated circuit without requiring additional external devices. However to perform a valid test, the BIST arrangement may isolate the "test" die from the other electronic components within the single multiple-integrated circuit in order to minimize the possibility of conflict. By isolating the "test" die, the "test" die connection with all other electronic components, beside the BIST arrangement, may be terminated.

Figure 3:
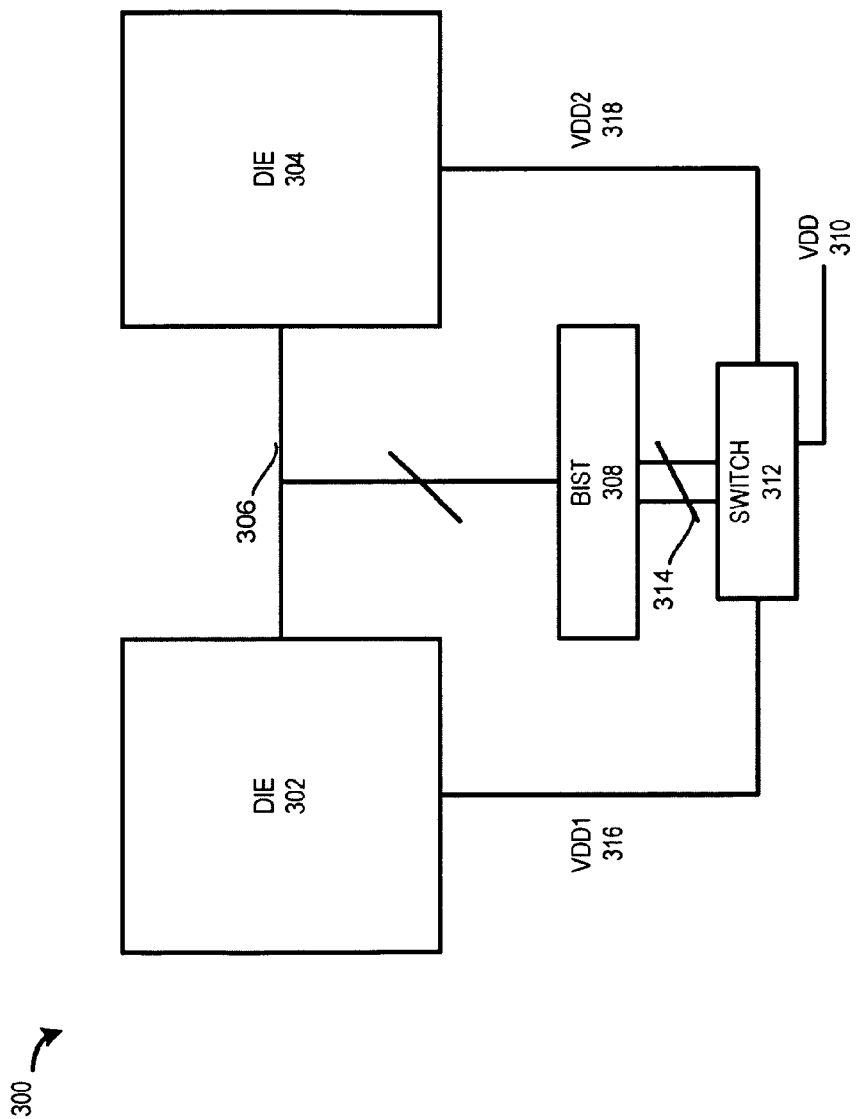
FIG. 3 shows, in an embodiment, a schematic diagram illustrating an arrangement for isolating a die in order to facilitate testing.

FIG. 3 shows, in an embodiment, a schematic diagram illustrating an arrangement for isolating a die in order to facilitate testing. As aforementioned, a single multiple-integrated circuit package may include a plurality of electronic components (including multiple dies and package parts). Each component is usually interacting with at least one other component. In an example, partial-view 300 may include a plurality of dies (302 and 304) that may be communicating with one another via a line 306.

Partial-view 300 may also include a BIST arrangement 308. If BIST arrangement 308 tries to control one of the dies along the same line 306, conflict may arise. Accordingly, to perform a test that is not unduly influenced from external factors, the component being tested may be isolated.

Consider a situation wherein, for example, BIST arrangement 308 has been employed to test die 302. Note that a test may be performed on a single die or a group of dies. To facilitate testing, BIST arrangement 308 may decouple die 302 from die 304, thereby preventing communication between the two dies. If the connection between the two dies is not terminated, conflict may arise when BIST arrangement 308 attempts to communicate with die 302. In other words, die 302 may not be able handle the communication coming in from die 304 while performing the test patterns sent by BIST arrangement 308.

In an embodiment, to create an isolated environment for testing, BIST arrangement 308 may isolate the "test" die (die 302) from the other electronic components, such as die 304. One way to create the isolated environment is to stop the flow of power to the other electronic components, such as die 304, thereby causing die 304 to become inactive.

As can be seen from FIG. 3, partial view 300 may include a power supply (Vdd) arrangement 310. To control the flow of power, a switch 312 may be coupled to power supply arrangement 310. In addition, switch 312 may be coupled to BIST arrangement via a set of control pins 314. When switch 312 is at "00", power is flowing from power supply 310 to a first power plane 316 (Vdd1) and a second power plane 318 (Vdd2).

Consider the situation wherein, for example, dies 302 and 304 are receiving power from power supply arrangement 310. Because both dies are in an active state, both dies may interact with one another. If BIST arrangement 308 wants to perform a test on die 302, BIST arrangement may send a control signal to switch 302 to move the switch setting from '00" to "01". In other words, when switch 312 is set to "01", power is no longer flowing from power supply arrangement 310 to die 304. As a result, by manipulating switch 312, BIST arrangement has effectively isolated die 302, thereby enabling BIST arrangement 308 to take control of line 306 in order to begin testing die 302.

Even though die 302 may be within a single multiple-integrated circuit package, the test patterns BIST arrangement 308 may employ to perform the test is relatively simple in comparison to the test patterns of the prior art. Unlike the prior art, the test patterns may not account for the other electronic components that may also be integrated within the same single multiple-integrated circuit package since the "test" die (die 302) has been isolated from all but BIST arrangement 308. In addition, since the test patterns for die 302 may be far less complex than that of the prior art, the testing time may also be significantly less.

With a BIST arrangement, a manufacturer may be able to identify single multiple-integrated circuit package with "bad" dies before assembling a product, such as an MP3 player. In the prior art, once a defective die has been identified in the prior art, the data may be employed to determine the "fate" of the single multiple-integrated circuit package. In an example, the manufacture may discard the single multiple-integrated circuit package, if the single multiple-integrated circuit package has poor performance yield. In another example, the manufacturer may integrate the single multiple-integrated circuit package into devices that may not require high performance yield.

Figure 4:
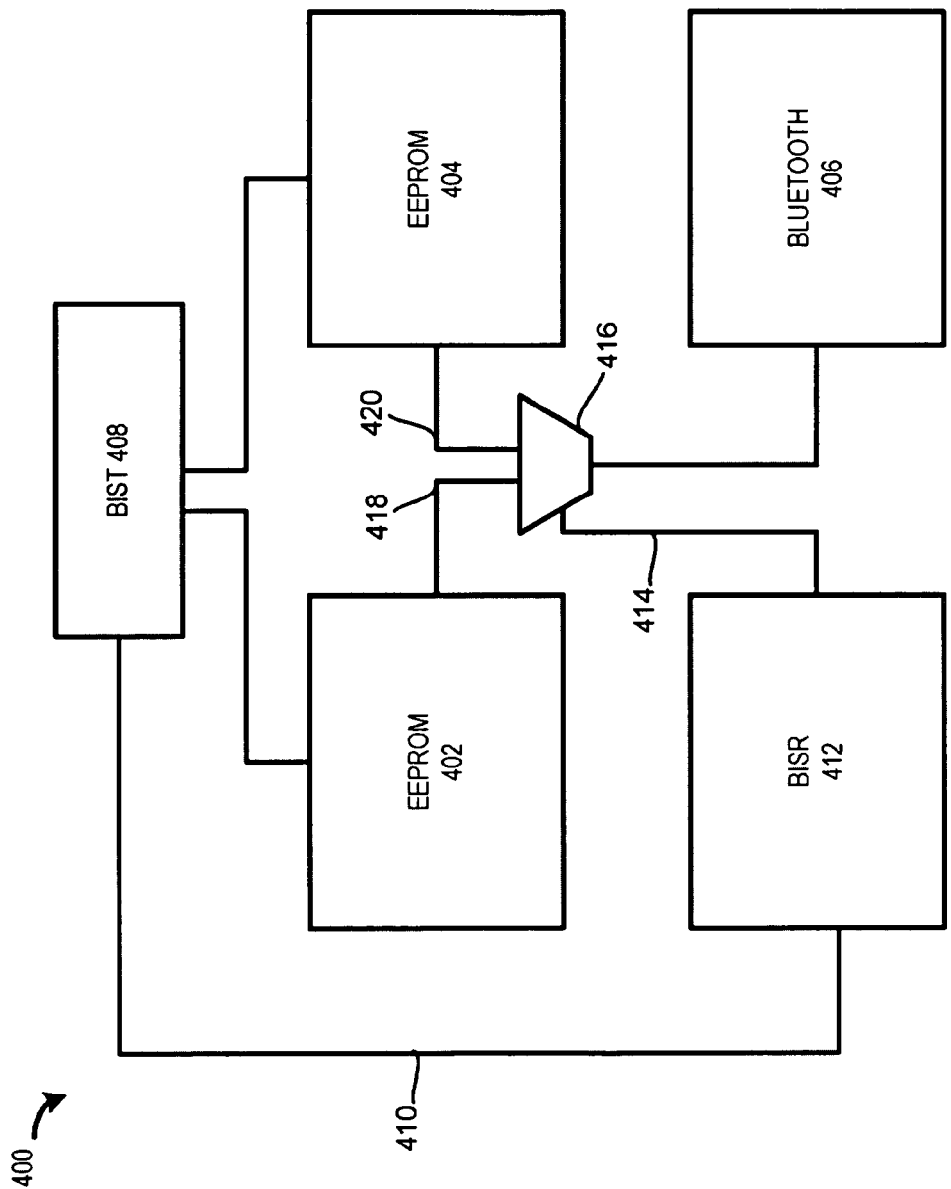
FIG. 4 shows, in an embodiment of the invention, a simple block diagram illustrating an arrangement for enabling a single multiple-integrated-circuit package to perform self-repair.

In contrast to the prior art, embodiments of the invention provide a redundancy arrangement that maximizes the performance yield for a single multiple-integrated circuit package by implementing a BISR arrangement. FIG. 4 shows, in an embodiment of the invention, a simple block diagram illustrating an arrangement for enabling a single multiple-integrated-circuit package to perform self-repair. As can be appreciated from the foregoing, a SiP 400 may include a plurality of interconnected dies (such as EEPROM die 402, EEPROM die 404, and Bluetooth die 406). Consider the situation wherein, for example, a BIST arrangement 408 has been initiated to test EEPROM die 402.

In the prior art, if a die fails the test, the performance of the SiP may usually be impacted. In an example, the SiP may experience low performance yield, thereby causing the electronic device to suffer performance inconsistency. Usually, no feasible solution is available to fix the problem when a "bad" die is identified. As a result, the SiP may be replaced in order to fix the performance issue of the electronic device. Thus, the replacement of the SiP may be a costly solution.

In contrast to the prior art, an embodiment of the invention provides a redundancy arrangement within a single multiple-integrated circuit package. In an example, redundant electronic components may be installed within the single multiple-integrated circuit package to handle potential failures. In an example, SiP 400 may include two EEPROM dies (402 and 404), with EEPROM die 404 acting as the redundant component. By having redundant components readily available, the cost of repairing SiP 400 is significantly less than that of replacing SiP 400 with another SiP.

Accordingly, the decision for including redundancy components may depend upon manufacturer's discretion. In an example, electronic components that are inexpensive may have redundant components. For example, the cost of a memory die may only be about 10 cents, the cost of a Bluetooth die may be about 2 dollars, and the cost of a Wi-Fi die is about $4.50. Given that economic consideration may be considered in creating a competitive product, a manufacturer may provide redundant components for the memory die but may choose not to provide a similar arrangement for the Bluetooth die and/or the Wi-Fi die. In comparison, another manufacturer may choose to create a redundancy arrangement for all three electronic components. Besides cost, other factors, such as the function of the electronic component, may be taken into consideration in determining a redundancy arrangement.

In an embodiment, a BISR arrangement 412 may be employed to facilitate the self-repair by SiP 400. In the example above, if EEPROM die 402 fails, then BIST arrangement 408 may send a first control signal along a line 410 to BISR arrangement 412. Upon receiving the first control signal, BISR arrangement 412 may send a second control signal along a line 414 to a multiplexer 416, which may be configured to select from one of the data sources (e.g., inputs 418 and 420) flowing from EEPROM die 402 and EEPROM die 404. In this example, since EEPROM die 402 is not functioning properly, BISR arrangement 412 may instruct multiplexer 416 to stop accepting input 418 from EEPROM die 402 and to begin accepting input 420 from EEPROM die 404. By selecting the input from EEPROM die 404, multiplexer 416 essentially establishes a connection between EEPROM die 404 and Bluetooth die 406.

Figure 5:
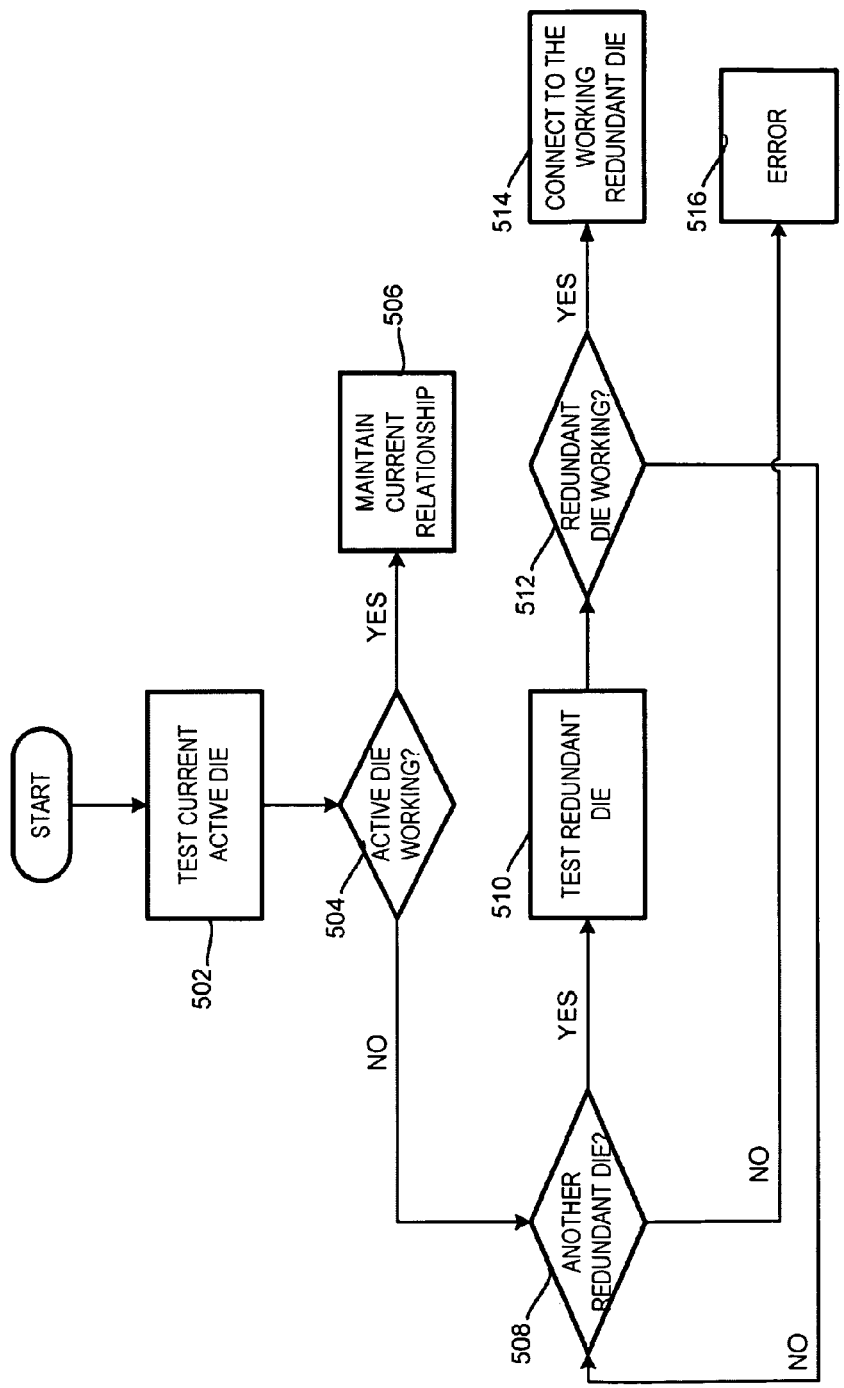
FIG. 5 shows, in an embodiment of the invention, a simplified flow chart illustrating the steps for implementing a built-in-self-test arrangement with a built-in-self-repair arrangement.

FIG. 5 shows, in an embodiment of the invention, a simplified flow chart illustrating the steps for implementing a BIST arrangement with a BISR arrangement. To facilitate discussion, FIG. 5 will be discussed in relation to FIG. 4. Consider the situation wherein, for example, BIST arrangement 408 is testing EEPROM die 402.

At a first step 502, the active die is tested by the BIST arrangement. In an example, BIST arrangement 408 may perform a test on EEPROM die 402.

At a next step 504, the status of the active die is determined. In an example, BIST arrangement 408 may determine the status of EEPROM die 402. In other words, if EEPROM die 402 passes the test, EEPROM die 402 may be considered as functioning properly. However, if EEPROM die 402 did not pass the test, then EEPROM die 402 may be considered as defective.

If EEPROM die 402 is performing properly, then at a next step 506, the control setting of multiplexer 416 may remain at "0", thereby enabling EEPROM die 402 to stay connected to Bluetooth die 406.

However, if at next step 504, the active die is defective, then the BIST arrangement may check to determine if a redundant die is available, at a next step 508.

If a redundant die is not available, then at a next step 516, the BIST arrangement may receive an error message. Accordingly, the status of each die that has been tested may be optionally routed through the set of input/output pins to an external device for further analysis.

However, if a redundant die is available at next step 508, then the redundant die is tested at a next step 510. In an example, if EEPROM die 402 is defective, BIST arrangement 408 may connect with EEPROM die 404 to begin testing the redundant die.

At a next step 512, BIST arrangement 408 make a determination on the status of the redundant die (EEPROM die 404).

If EEPROM die 404 does not pass the test, then the method may return to step 508 to look for another redundant die to test. Steps 508-512 may be a reiterative process until no additional redundant die is available or a redundant die has passed the test.

Returning to step 512, if a redundant die has passed the test, then the "bad" die is replaced by the "good" die, at a next step 514. In an example, if EEPROM die 404 passes the test, then BIST arrangement 408 may send a first control signal to BISR arrangement 412. In an embodiment, the first control signal may include the status of the current active die (i.e., EEPROM die 402) and the status of the redundant die (i.e., EEPROM die 404). After receiving the first control signal, BISR arrangement 412 may send a second control signal to multiplexer 416 with instruction for activating the redundancy component. In an example, BISR arrangement 412 may instruct multiplexer 416 to stop accepting input 418 from EEPROM die 402, thereby effectively terminating the connection between EEPROM die 402 and Bluetooth die 406. Within the same control signal. BISR arrangement 412 may instruct multiplexer 416 to begin accepting inputs 420 from EEPROM die 404, thereby establishing a connection between EEPROM die 404 and Bluetooth die 406.

As can be appreciated from embodiments of the invention, a BIST arrangement provides a single multiple-integrated circuit package with an automatic internal self-testing arrangement. By implementing the BIST arrangement, the manufacturers are able to meet consumer's demand for smaller form factor without losing the ability to perform die testing. In addition, a BISR arrangement may be included to enable the single multiple-integrated circuit arrangement to perform self-repairing. With a combination of the BIST arrangement and the BISR arrangement, the single multiple-integrated circuit may experience a higher performance yield while minimizing cost and waste.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A multiple integrated circuit arrangement within a single package, said multiple integrated circuit arrangement including a set of electronic components, said set of electronic components including at least a set of dies, said set of dies including at least a first die and a second die, wherein said first die is coupled to a first electronic component of said set of electronic components, and wherein said first electronic component is not said first die, said multiple integrated circuit arrangement comprising:
- a switch coupled to at least a power supply arrangement, said first die, and said second die;
- a built-in-self-test (BIST) arrangement, said BIST arrangement being at least partly encapsulated within said single package, said BIST arrangement including
- at least a BIST die, said BIST die being coupled to said switch, said BIST die being configured to send a first control signal to said switch, said first control signal instructing said switch to power said first die and to stop powering said second die, wherein said BIST arrangement is configured for at least testing said first die; and
- a built-in-self-repair (BISR) arrangement, said BISR arrangement being at least partly encapsulated within said single package, wherein said BISR arrangement is configured for at least repairing said multiple integrated circuit arrangement.

2. The multiple integrated circuit arrangement of claim 1 further comprising a control pin coupled between said switch and said BIST die, said BIST die being coupled with said switch through said control pin, said control pin being configured to perform at least one of activating said BIST arrangement and deactivating said BIST arrangement.

3. The multiple integrated circuit arrangement of claim 1 further comprising a multiplexer coupled to said BISR arrangement, wherein
- said BIST arrangement is configured to send a second control signal to said BISR arrangement,
- said BISR arrangement is configured to send a third control signal to said multiplexer in response to said second control signal,
- said multiplexer is configured to stop accepting first input from said first die after receiving said third control signal, and
- said multiplexer is further configured to begin accepting second input from said second die after receiving said third control signal.

4. The multiple integrated circuit arrangement of claim 1 wherein said BIST arrangement includes a set of pins, and wherein at least one of said set of pins is configured for at least coupling said BIST die with said BIST arrangement.

5. The multiple integrated circuit arrangement of claim 1 wherein said BISR arrangement is configured for at least receiving a set of control signals from said BIST arrangement when said first die fails said testing.

6. The multiple integrated circuit arrangement of claim 1 wherein said BISR arrangement is configured for at least sending a set of control signals to a multiplexer, said set of control signals including at least instructions for deselecting a first input from said first die and selecting a second input from said second die, therefore decoupling said first die from said first electronic component and coupling said second die with said first electronic component.

7. The multiple integrated circuit arrangement of claim 1 wherein said BISR arrangement is configured for at least receiving a set of control signals from said BIST arrangement when said first die fails said testing and said second die has passed a test performed by said BIST arrangement.

8. The multiple integrated circuit arrangement of claim 1 wherein said BIST arrangement further includes at least an input pin for coupling with a computer system and for receiving updated test patterns from said computer system, said BIST arrangement being further configured to store said updated test patterns.

9. The multiple integrated circuit arrangement of claim 1 wherein said BISR arrangement is configured for at least sending a set of control signals to a multiplexer, said set of control signals including at least instructions for deselecting a first input from said first die and selecting a second input from said second die, therefore decoupling said first die from said first electronic component and coupling said second die with said first electronic component.

10. A method for performing self-repair by a multiple integrated circuit arrangement within a single package, said method comprising:
- providing a set of electronic components, said set of electronic components including at least a set of dies, said set of dies including at least a first die and a second die, wherein said first die is coupled to a first electronic component of said set of electronic components, and wherein said first electronic component is not said first die;
- providing a built-in-self-test (BIST) arrangement, said BIST arrangement being at least partly encapsulated within said single package, said BIST arrangement including at least a BIST die, wherein said BIST arrangement is configured for at least testing said first die;
- sending a first control signal from said BIST die to a switch, said first control signal instructing said switch to power said first die and to stop powering said second die, wherein said switch is coupled to said BIST die, said first die, said second die, and a power supply arrangement; and
- using a built-in-self-repair (BISR) arrangement to repair said first die, said BISR arrangement being at least partly encapsulated within said single package.

11. The method of claim 10 further comprising using a control pin to activate said BIST arrangement, said control pin being coupled between said BIST die and said switch, said BIST die being coupled to said switch through said control pin.

12. The method of claim 10 further comprising sending a set of control signals from said BISR arrangement to a multiplexer, said set of control signals including at least instructions for deselecting a first input from said first die and selecting a second input from said second die, therefore decoupling said first die from said first electronic component and coupling said second die with said first electronic component.

13. The method of claim 10 further comprising sending a set of control signals from said BIST arrangement to said BISR arrangement when said first die fails said testing.

14. The method of claim 10 further comprising:
- sending a second control signal from said BIST die to said BISR arrangement after said testing said first die;
- sending a third control signal from said BISR arrangement to a multiplexer in response to said second control signal;
- using said third control signal to instruct said multiplexer to stop accepting first input from said first die; and
- using said third control signal to instruct said multiplexer to begin accepting second input from said second die.

15. The method of claim 10 further comprising using a control pin to deactivate said BIST arrangement, said control pin being coupled between said BIST die and said switch, said BIST die being coupled to said switch through said control pin.

16. A multiple integrated circuit arrangement within a single package, said multiple integrated circuit arrangement including a set of electronic components, said set of electronic components including at least a set of dies, said set of dies including at least a first die and a second die, said second die being a redundant die of said first die, wherein said first die is coupled to a first electronic component of said set of electronic components, and wherein said first electronic component is not said first die, said multiple integrated circuit arrangement comprising:

a switch coupled to at least a power supply arrangement, said first die, and said second die;

a built-in-self-test (BIST) arrangement including at least a BIST die, said BIST die coupled to said switch, said BIST die storing a set of test patterns for at least testing said first die, said BIST die being configured to send a first control signal to said switch, said first control signal instructing said switch to power said first die and to stop powering said second die, and a built-in-self-repair (BISR) arrangement for repairing said multiple integrated circuit arrangement when said first die fails said testing.

17. The multiple integrated circuit arrangement of claim 16 further comprising a control pin coupled between said switch and said BIST die, said BIST die being coupled with said switch through said control pin, said control pin being configured to perform at least one of activating said BIST arrangement and deactivating said BIST arrangement.

18. The multiple integrated circuit arrangement of claim 16 further comprising a multiplexer coupled to said BISR arrangement, wherein said BIST arrangement is configured to send a second control signal to said BISR arrangement, said BISR arrangement is configured to send a third control signal to said multiplexer in response to said second control signal, said multiplexer is configured to stop accepting first input from said first die after receiving said third control signal, and said multiplexer is further configured to begin accepting second input from said second die after receiving said third control signal.

19. The multiple integrated circuit arrangement of claim 16 wherein said BISR arrangement includes a set of pins, and wherein at least one of said set of pins is configured for at least coupling said BISR arrangement with said BIST arrangement.

20. The multiple integrated circuit arrangement of claim 16 wherein said BISR arrangement is configured for at least receiving a first set of control signals from said BIST arrangement when said first die fails said testing.

\* \* \* \* \*